United States Patent [19]

Ohsawa

[11] 4,139,824
[45] Feb. 13, 1979

[54] GAIN CONTROL CIRCUIT
[75] Inventor: Mitsuo Ohsawa, Fujisawa, Japan
[73] Assignee: Sony Corporation, Tokyo, Japan
[21] Appl. No.: 806,458
[22] Filed: Jun. 14, 1977
[30] Foreign Application Priority Data
    Jun. 17, 1976 [JP] Japan .................................. 51-71346
[51] Int. Cl.² .......................... H03G 3/30; H03F 3/45
[52] U.S. Cl. ..................................... 330/254; 330/284
[58] Field of Search ............... 330/145, 254, 284, 288; 307/264

[56] References Cited

U.S. PATENT DOCUMENTS

| | | | |
|---|---|---|---|
| 3,098,199 | 7/1963 | Carney et al. | 330/145 X |
| 3,706,937 | 12/1972 | Hanna | 330/254 |
| 3,731,215 | 5/1973 | Peil et al. | 330/254 |
| 3,902,077 | 8/1975 | Takemura et al. | 330/284 X |
| 3,974,400 | 8/1976 | Takeda et al. | 330/284 X |
| 3,988,598 | 10/1976 | Ishigaki et al. | 330/254 X |

FOREIGN PATENT DOCUMENTS 2275070  1/1976  France ..................................... 330/254

Primary Examiner—James B. Mullins
Attorney, Agent, or Firm—Hill, Gross, Simpson, Van Santen, Steadman, Chiara & Simpson

[57] ABSTRACT

A gain control circuit includes first and second variable impedance devices connected between signal input and signal output terminals. A first current source (or sink) is connected to the connection point of the impedance devices and second and third current sinks (or sources) are connected to the input and output terminals. The output signal is controlled by varying the currents of the first through third current sources (or sinks) in such a way that the current value of the first current source (or sink) equals the total current value of the second and third current sinks (or sources).

11 Claims, 7 Drawing Figures

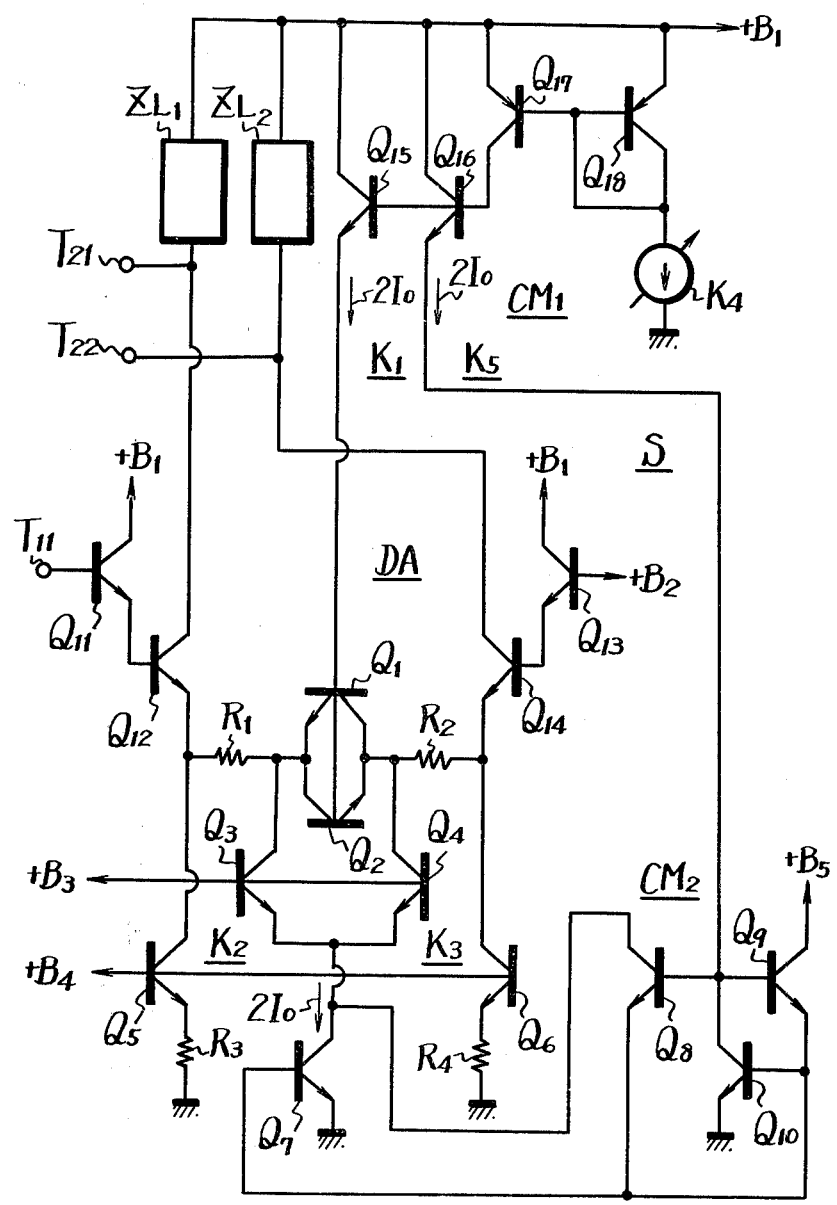

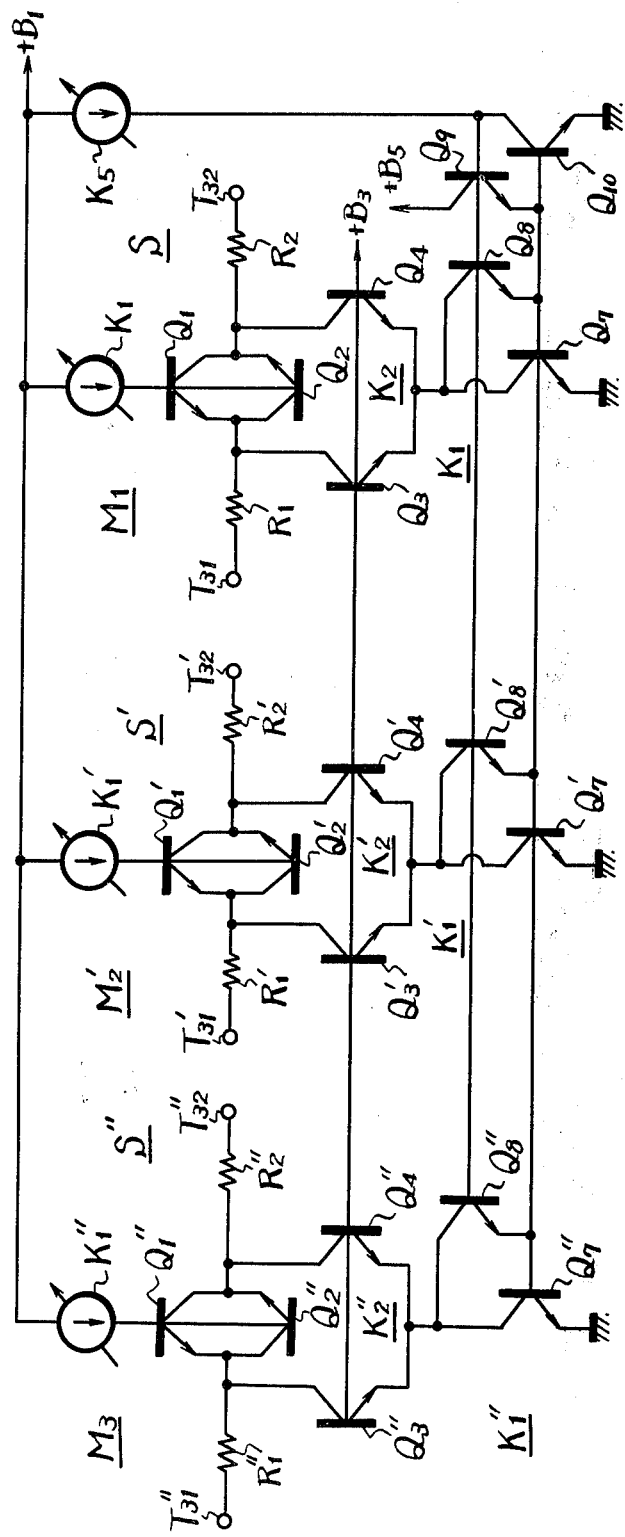

GAIN CONTROL CIRCUIT

BACKGROUND OF THE INVENTION

1. Field of the Invention

The present invention relates generally to a gain control circuit, and is directed more particularly to a gain control circuit which contributes less distortion to a signal to be controlled and in which a DC potential is prevented from fluctuating during control of the signal.

2. Description of the Prior Art

In the art a gain control circuit has been known in which the current flowing through a variable impedance element is controlled to thereby control the gain of the circuit. Such a kind of gain control circuit is disclosed in U.S. Pat. No. 3,678,403 "Balanced Variable Gain Amplifier" by Jack Craft, Assigned to RCA, Issued on July 18, 1972. With such circuits, however, the variable control range cannot be widened very much and its circuit construction becomes complicated.

SUMMARY OF THE INVENTION

Accordingly, a main object of the present invention is to provide a gain control circuit free from the defects inherent in the prior art.

Another object of the invention is to provide a gain control circuit whose gain control range can be widened.

A further object of the invention is to provide a gain control circuit whose DC potential is not fluctuated upon control of a signal.

In accordance with one example of the present invention there is provided a gain control circuit which includes an input terminal supplied with an input signal to be controlled, an output terminal for deriving an output signal, and first and second variable impedance circuits connected in series between the input and output terminals. A first current source circuit is connected to the connection point of the first and second variable impedance circuits, and second and third current source circuits are each connected to the input and output terminals, respectively. Each current value of the second and third current source circuits is substantially equal to one half of that of the first current source circuit, and each of the current flow directions of the second and third current source circuits is opposite with respect to said first current source circuit, (i.e., if the first circuit is a source and second and third circuits are current sinks and vice versa.) The output signal is controlled by varying the currents of the first, second and third current source circuits in such a way that the current value of the first current source equals the total current value of the second and third current source circuits.

Other objects, features and advantages of the invention will become apparent from the following description taken in conjunction with the accompanying drawings in which like references represent like elements.

BRIEF DESCRIPTION OF THE DRAWINGS

FIG. 5 is a circuit diagram showing a practical embodiment of the gain control circuit according to the invention;

FIG. 7 is a circuit diagram showing another practical embodiment of the invention.

DESCRIPTION OF THE PREFERRED EMBODIMENTS

The present invention will be hereinafter described with reference to the drawings.

First, a fundamental embodiment of the invention will be described with reference to FIG. 1. In the figure, $t_1$ and $t_2$ indicate signal input and output terminals, respectively, $D_1$ and $D_2$ indicate a pair of diodes (silicon diodes) comprising a pair of semiconductor elements whose voltage-current characteristics are different in the forward and backward directions between a pair of electrodes, for example, anode and cathode electrodes, in this example. These diodes $D_1$ and $D_2$ are connected between the input and output terminals $t_1$ and $t_2$ such that their current-voltage characteristics are equal in the forward and backward directions. That is, the cathode of diode $D_1$ is connected to the input terminal $t_1$, its anode is connected to the anode of the other diode $D_2$, and its cathode is connected to output terminal $t_2$, respectively.

Figure 1:
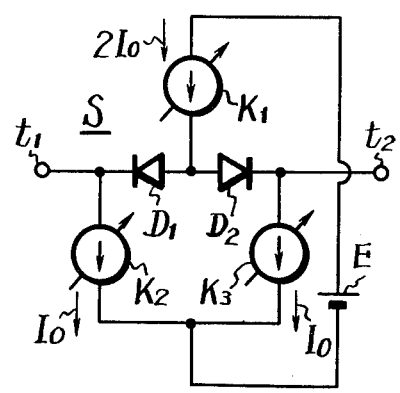
FIGS. 1 to 4 are circuit diagrams showing fundamental preferred embodiments of the present invention.

In FIG. 1, reference character S designates a current source circuit which supplies a DC control voltage of the same polarity and value across the pair of electrodes of each of diodes $D_1$ and $D_2$ or the anodes and cathodes thereof, respectively. In this example, the current source circuit S is formed of a constant current source circuit (current source circuit) $K_1$ and constant current source circuits (current sink circuits) $K_2$ and $K_3$. E designates a DC voltage source whose positive electrode is connected through the constant current source circuit $K_1$ to the anodes of diodes $D_1$ and $D_2$ in common fashion, and whose negative electrode is connected through constant current source circuits $K_2$ and $K_3$ to the cathodes of diodes $D_1$ and $D_2$, respectively. In this case, it is assumed that the DC current flowing through the constant current source circuit $K_1$ is $2I_0$, the DC currents flowing through the constant current source circuits $K_2$ and $K_3$ are $I_0$, and the constant current sources $K_1$, $K_2$ and $K_3$ can be varied such that the DC currents therefrom are varied in proportion with one another. Accordingly, in this case the constant currents $I_0$ flowing through the constant current source circuits (current sink circuits) $K_2$ and $K_3$ are equal with each other and hence their sum current $2I_0$ flows through the constant current source circuit $K_1$. Therefore, in this case, through the diodes $D_1$ and $D_2$ or between the anodes and cathodes of diodes $D_1$ and $D_2$ there flow the DC currents $I_0$ which are equal in polarity and value. If the control DC current from the current supply circuit S is varied to be a suitable value, the gain between input and output terminals $t_1$ and $t_2$ can be varied to a suitable value. In this case, if the DC current $I_0$ is selected maximum or almost zero, the circuit shown in FIG. 1 can serve as a switching or gate circuit.

Figure 2:
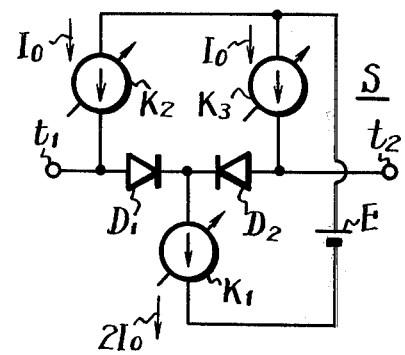

Another example of the invention will be now described with reference to FIG. 2. In this example, the diodes $D_1$ and $D_2$ are connected opposite in polarity to those of $D_1$ and $D_2$ shown in FIG. 1, that is, the anodes of diodes $D_1$ and $D_2$ are connected to input and output terminals $t_1$ and $t_2$, respectively, and their cathodes are connected together to the constant current source circuit $K_1$. In this case, the construction of current supply circuit S is opposite to that of circuit S shown in FIG. 1. That is, the positive electrode of DC voltage source E is connected through current source circuits $K_2$ and $K_3$ to the anodes of diodes $D_1$ and $D_2$, respectively, and the negative electrode of DC voltage source E is connected through current sink circuit $K_1$ to the cathodes of diodes $D_1$ and $D_2$, respectively. In this case, the constant currents $I_0$ of constant current sources $K_2$ and $K_3$ and constant current $2I_0$ of current sink circuit $K_1$ are varied simultaneously in proportion with one another, as in the case of FIG. 1.

Figure 3:
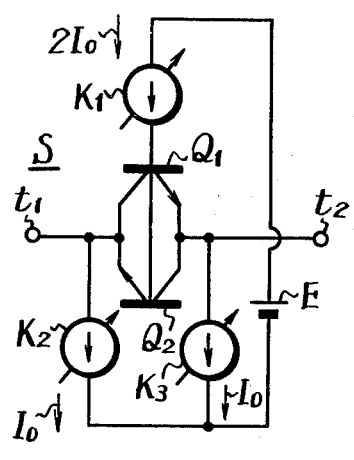

With reference to FIG. 3, a further example of the invention will be described. In this example, as semiconductor elements, bi-polar transistors $Q_1$ and $Q_2$ of an NPN type are used, and the collector of transistor $Q_1$ and emitter of transistor $Q_2$ are connected together to input terminal $t_1$, while the emitter of transistor $Q_1$ and collector of transistor $Q_2$ are connected together to the output terminal $t_2$, respectively. Furthermore, the positive electrode of DC voltage source E is connected through the constant current source circuit $K_1$ to the bases of transistors $Q_1$ and $Q_2$, and the negative electrode of DC voltage source E is connected through the current sink circuit $K_2$ to the connection point of the collector and emitter of transistors $Q_1$, $Q_2$ and through the current sink circuit $K_3$ to the connection point of the emitter and collector of transistors $Q_1$, $Q_2$, respectively. In this case, the constant current of constant current source circuit $K_1$ is taken as $2I_0$, and those of current sink circuits $K_2$ and $K_3$ are taken as $I_0$, respectively. As a result, the DC currents $I_0$, which are equal in polarity and value, flow through the base-emitter of each of transistors $Q_1$ and $Q_2$, respectively.

Figure 4:
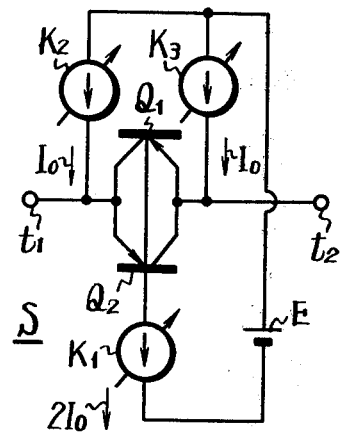

A further example of the invention will be described with reference to FIG. 4, in which PNP type transistors are used as the transistors $Q_1$ and $Q_2$, respectively. In this case, the positive electrode of DC voltage source E is connected through constant current source circuits $K_2$ and $K_3$ to the connection point of the collector of transistor $Q_1$ and emitter of transistor $Q_2$ and to the connection point of the emitter of transistor $Q_1$ and collector of transistor $Q_2$, respectively, while the negative electrode of DC power source E is connected through constant current source circuit $K_1$ to the bases of transistors $Q_1$ and $Q_2$. In this case, the constant currents $I_0$ of constant current source circuits $K_2$, $K_3$ and constant current $2I_0$ of constant current source circuit $K_1$ are varied simultaneously in proportion.

In the examples shown in FIGS. 1 to 4, the current $I_0$ is selected as a small current of about 500 μA to 2 mA to avoid distortion of a signal current flowing through the circuit. In this case, it may be possible to connect a series connection of resistors, which have the same resistance, between input and output terminals $t_1$ and $t_2$ with the result that the gain variable range of the circuit becomes narrow but the distortion ratio is greatly decreased.

A more practical example of the gain control circuit according to the invention will be described with reference to FIG. 5 whose fundamental construction is that of the circuit shown in FIG. 3, so that the elements of FIG. 5 corresponding to those of FIG. 3 are marked with the same reference numerals. In FIG. 5, reference letters DA designate a differential amplifier formed of NPN type transistors $Q_{11}$, $Q_{12}$, $Q_{13}$, $Q_{14}$, $Q_5$ and $Q_6$, in which the emitters of transistors $Q_{12}$ and $Q_{14}$ are connected to the collectors of transistors $Q_5$ and $Q_6$, respectively, the emitters of transistors $Q_5$ and $Q_6$ are grounded through resistors $R_3$ and $R_4$ of the same resistance value, and the bases of transistors $Q_5$ and $Q_6$ are connected commonly to a base bias voltage source $+B_4$. The collectors of transistors $Q_{12}$ and $Q_{14}$ are connected through loads $Z_{L1}$ and $Z_{L2}$ to a voltage source $+B$, respectively, and output terminals $T_{21}$ and $T_{22}$ are connected to the collectors of transistors $Q_{12}$ and $Q_{14}$, respectively. The emitter of transistor $Q_{11}$, whose base is connected to an input terminal $T_{11}$, is connected to the base of transistor $Q_{12}$, and the collector of transistor $Q_{11}$ is connected to the voltage source $+B_1$. Further, the emitter of transistor $Q_{13}$, whose base is connected to a reference base bias voltage source $B_2$, is connected to the base of transistor $Q_{14}$ and the collector of the former transistor is connected to voltage source $+B$.

Thus, between the emitters of transistors $Q_{12}$ and $Q_{14}$ of the above differential amplifier DA there is connected the variable gain (control) circuit described in connection with FIG. 3. That is, the emitter of NPN type transistor $Q_1$ and the collector of NPN type transistor $Q_2$ are connected together through a resistor $R_1$ to the emitter of transistor $Q_{12}$, and the collector of transistor $Q_1$ and the emitter of transistor $Q_2$ are connected together through a resistor $R_2$, whose resistance value is selected the same as that of resistor $R_1$, to the emitter of transistor $Q_{14}$.

In this case, through the base and emitter of each of transistors $Q_1$ and $Q_2$ there flows an equal DC current from a current supply means S, which is formed as follows. A current mirror circuit $CM_1$ is provided which is formed of PNP type transistors $Q_{17}$, $Q_{18}$, NPN type transistors $Q_{15}$, $Q_{16}$ and a constant current source circuit $K_4$. In this case, it is possible that transistors $Q_{17}$ and $Q_{18}$ are provided as well-known lateral transistors, transistors $Q_{15}$ and $Q_{16}$ are provided as well-known vertical transistors and these transistors $Q_{15}$ to $Q_{18}$ are made as an integrated circuit. The emitters of transistors $Q_{17}$ to $Q_{18}$ are connected together to voltage source $+B_1$, and their bases are connected together to the collector of transistor $Q_{18}$ which is in turn grounded through constant current-source circuit $K_4$. Further, the collector of transistor $Q_{17}$ is connected to the bases of transistors $Q_{15}$ and $Q_{16}$ whose collectors are connected together to DC voltage source $+B_1$. By controlling the current mirror circuit $CM_1$, DC current $2I_0$ flows through the emitters of transistors $Q_{15}$ and $Q_{16}$, respectively. Since the emitter of transistor $Q_{15}$ is connected to the bases of transistors $Q_1$ and $Q_2$, respectively, DC current $2I_0$ flows through the bases of transistors $Q_1$ and $Q_2$, respectively.

Another current mirror circuit $CM_2$ is also provided which is formed of NPN type transistors $Q_7$, $Q_9$ and $Q_{10}$. The base of transistor $Q_9$ is connected to the emitter of transistor $Q_{16}$, the collector of the former is connected to power source $+B_5$ and the emitter of transistor $Q_9$ is connected to the bases of transistors $Q_{10}$ and $Q_7$. The collector of transistor $Q_{10}$ is connected to the base of transistor $Q_9$ and the emitter of the former is grounded.

Transistors $Q_3$ and $Q_4$ are also provided. The collector of transistor $Q_3$ is connected to the emitter of transistor $Q_1$ and the collector of transistor $Q_2$, while the collector of transistor $Q_4$ is connected to the collector of transistor $Q_1$ and the emitter of transistor $Q_2$. The emitters of transistors $Q_3$ and $Q_4$ are connected together to the collector of transistor $Q_7$ of current mirror circuit $CM_2$, and the emitter of transistor $Q_7$ is grounded. The bases of transistors $Q_3$ and $Q_4$ are connected commonly to base bias voltage source $+B_3$.

In the example of FIG. 5, NPN type transistor $Q_8$ is provided whose collector is connected to the collector of transistor $Q_7$, and whose emitter is connected to the base of transistor $Q_7$.

Thus, in the example of FIG. 5, the constant current source circuit $K_1$ is composed of current mirror circuit $CM_1$, and constant current source circuits $K_2$ and $K_3$ are composed of transistors $Q_3$, $Q_4$ and $Q_8$ and current mirror circuit $CM_2$. In this case, DC current $I_0$ flows through transistors $Q_3$ and $Q_4$, respectively.

Figure 6:
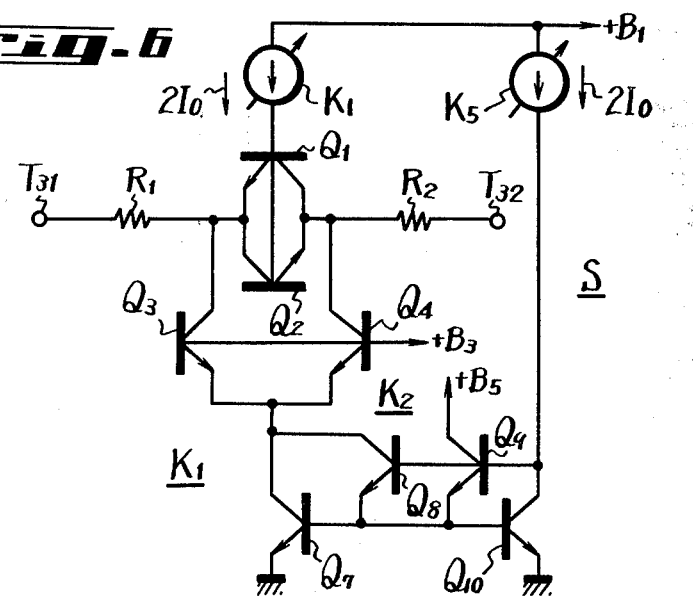
FIG. 6 is a connection diagram showing a portion of the gain control circuit shown in FIG. 5.

The operation of the circuit shown in FIG. 5 will be explained with reference to FIG. 6 which is a simplified form of that shown in FIG. 5 so that the portions of FIG. 6 corresponding to those of FIG. 5 are marked with the same references. In FIG. 6, transistors $Q_{15}$ and $Q_{16}$ of current mirror circuit $CM_1$ are shown as constant current source circuits $K_1$ and $K_5$, respectively, and DC current $2I_0$ flows through constant current source circuits $K_1$ and $K_5$, respectively. Also, DC current $2I_0$ flows through the collectors of transistors $Q_{10}$ and $Q_7$, respectively, and DC current $I_0$ flows through the collectors of transistors $Q_3$ and $Q_4$, respectively. In FIG. 6, $T_{31}$ and $T_{32}$ represent input and output terminals, respectively.

In this case, since base bias source $+B_3$ is connected to the bases of transistors $Q_3$ and $Q_4$, the base current flows to the bases of transistor $Q_3$ and $Q_4$ from source $+B_3$. As a result, the emitter current of transistors $Q_3$ and $Q_4$ does not exactly become DC current $I_0$, but becomes the sum of DC current $I_0$ and the base current thereof. The base current of transistors $Q_3$ and $Q_4$ is about $2I_0/{}^hFE$. For this reason, the transistor $Q_8$ is provided to flow through its collector-emitter a current $2I_0/{}^hFE$. That is, the base current, which flows through transistors $Q_8$ and $Q_9$, becomes $2I_0/{}^hFE^2$, and the base current of transistors $Q_7$ and $Q_{10}$ becomes $2I_0/{}^hFE$, respectively. As a result, due to the provision of transistor $Q_8$, the sum of collector current $2I_0$ of transistor $Q_3$ and $Q_4$ can be made coincident correctly with collector current $2I_0$ of transistor $Q_7$ (the error of this case is $2I_0/{}^hFE^2$). Thus, when the transistor $Q_8$ is provided, the sum of currents flowing through the current source and current sink circuits in current supply means S can be made equal with greater accuracy. In this case, it is possible that the transistor $Q_9$ is connected in a Darlington manner.

In the example of the invention shown in FIGS. 5 and 6, the error in constant currents is in the order of 1 $\mu A$ to 3 $\mu A$, so that when it is considered that the constant current $I_0$ is 1000 $\mu A$ to 3000 $\mu A$, the relative error becomes about 0.1%.

FIG. 7 is a connection diagram showing a further example of the invention formed by connecting in parallel, a plurality of the variable gain or control circuits shown in FIG. 6, so that in FIG. 7 the same elements as those of FIG. 6 are marked with the same reference each with a prime and primes, respectively. In the example of FIG. 7, the constant current source circuit $K_5$ and transistors $Q_9$, $Q_{10}$ are used commonly so that the gains of a plurality of, for example, three variable gain circuits $M_1$ to $M_3$ can be varied simultaneously and in the same ratio as the constant currents of constant current source circuits $K_1$ and $K_5$.

In the example shown in FIG. 7, the bases of transistors $Q_7$, $Q_7'$ and $Q_7''$ of the respective gain variable control circuits $M_1$, $M_2$ and $M_3$ are connected commonly to the base of transistor $Q_{10}$, but this common connection is not always necessary.

The variable gain circuits according to the invention described above give less distortion to a signal to be controlled and are suitable for use as a gain control circuit, switching circuit, gate circuit and the like.

Further, in the circuit of the invention if the resistance values of resistors connected between the input and output terminals thereof are suitably selected, the distortion of a signal to be controlled can be reduced further or the gain can be controlled over a wide control range if distortion is allowed to some extent.

The variable gain circuit of the invention is also suitable for being made as an integrated circuit.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A gain control circuit comprising:
   (a) an input terminal supplied with an input signal to be controlled;
   (b) an output terminal for deriving an output signal;
   (c) first and second variable impedance means connected in series between said input and output terminals;
   (d) first variable current source means connected to the connection point of said first and second variable impedance means;
   (e) second and third variable current source means respectively connected to said input and output terminals, said first, second and third variable current source means varying during gain control such that a current value of each of said second and third current sources is substantially equal to one half of that of said first current source, and the current flow directions of said second and third current sources is opposite with respect to said first current source so as to provide a source and sink for currents through the variable impedance means; and
   (f) a plural set of said input and output terminals, first and second variable impedance means, and first, second and third current source means are provided, and each set of said second and third current sources are controlled by a common current regulating means;
   whereby the output signal is controlled by varying the currents of said first, second and third current sources in such a way that the current value of said first current source equals the total current value of said second and third current sources.

2. A gain control circuit according to claim 1, in which said first and second variable impedance means comprise a pair of first and second transistors each having base, emitter and collector electrodes and having NPN type conductivity, the base electrodes thereof being connected together to said first current source, the collector-emitter circuit of said first transistor and the emitter-collector circuit of said second transistor being connected between said input and output terminals, respectively.

3. A gain control circuit comprising:
   (a) an input terminal supplied with an input signal to be controlled;
   (b) an output terminal for deriving an output signal;
   (c) first and second variable impedance means connected in series between said input and output terminals;

(d) first current source means connected to the connection point of said first and second variable impedance means;
(e) second and third current source means respectively connected to said input and output terminals in which each current value of said second and third current sources is substantially equal to one half of that of said first current source, and the current flow directions of said second and third current sources is opposite with respect to said first current source so as to provide a source and sink for currents through the variable impedance means; and
(f) said first through third current sources comprising:
  (i) first current mirror circuit means having a pair of current supply terminals, each substantially supplying the same current therefrom, one terminal of which is connected to the connection point of said first and second variable impedance means;
  (ii) second current mirror circuit means having a pair of current sink terminals, each substantially sinking the same current as that of each of said current supply terminals, one terminal of which is connected to the other current supply terminal of said first current mirror circuit means; and
  (iii) first and second current paths, one side of each of which is connected to each other and to the other current sink terminal of said second current mirror circuit means, and each of the other sides of which is connected to said input and output terminals, respectively;
whereby the output signal is controlled by varying the currents of said first, second and third current sources in such a way that the current value of said first current source equals the total current value of said second and third current sources.

4. A gain control circuit according to claim 3, in which said first current mirror circuit means comprises:
(a) a first reference DC potential;
(b) a first transistor having base, emitter and collector electrodes, the emitter electrode thereof being connected to said first reference DC potential, both the base and collector electrodes thereof being connected together to a second reference DC potential;
(c) a second transistor having base, emitter and collector electrodes, the emitter and base electrodes thereof being connected between the emitter and base electrodes of said first transistor, respectively;
(d) a third transistor having base, emitter and collector electrodes, the collector and base electrodes thereof being connected between the emitter and collector electrodes of said second transistor, and the emitter electrode thereof being one of said current supply terminals; and
(e) a fourth transistor having base, emitter and collector electrodes, the collector and base electrodes thereof being connected between the collector and base electrodes of said third transistor, and the emitter electrode thereof being the other of said current supply terminals.

5. A gain control circuit according to claim 4, in which said second current mirror circuit means comprises:
(a) a fifth transistor having base, emitter and collector electrodes, the collector electrode thereof being connected to the emitter electrode of said third transistor, the emitter electrode thereof being connected to said second reference DC potential, and the base electrode thereof being connected through a direct current circuit to the collector electrode thereof; and
(b) a sixth transistor having base, emitter and collector electrodes, the base electrode thereof being connected to the base electrode of said fifth transistor, the emitter electrode thereof being connected to said second reference DC potential, the collector electrode thereof being connected the connection point of said first and second current paths.

6. A gain control circuit according to claim 5, in which said first and second current paths comprise seventh and eighth transistors each having base, emitter and collector electrode, their emitter electrodes being connected to each other and to the collector electrode of said sixth transistor, their base electrodes being connected together to a third reference DC potential, and their collector electrodes being connected to said input and output terminals, respectively.

7. A gain control circuit according to claim 5, further including a ninth transistor having base, emitter and collector electrodes, the base-emitter circuit of which forms said direct current circuit of said current mirror circuit, and the collector electrode of which is connected to a fourth reference DC potential.

8. A gain control circuit according to claim 7, further including a tenth transistor having base, emitter and collector electrodes, the base electrode thereof being connected to the collector electrodes of said fifth transistor, the emitter electrode thereof being connected to the base electrode of said fifth transistor, and the collector electrode thereof being connected to the collector electrode of said sixth transistor;
whereby an error with respect to the base currents of said seventh and eighth transistors is compensated by the collector current of said tenth transistor.

9. A gain control circuit according to claim 8, further including a differential amplifier comprising:
(a) eleventh through fourteenth transistors each having base, emitter and collector electrodes;
(b) circuit means for connecting each of the collector-emitter circuits of said eleventh and thirteenth transistors in series between said first and second reference DC potentials through a first load;
(c) circuit means for connecting each of the collector-emitter circuits of said twelfth and fourteenth transistors in series between said first and second reference DC potentials through a second load;
(d) circuit means for connecting the base electrodes of said thirteenth and fourteenth transistors to a fifth reference DC potential;
(e) circuit means for connecting said input and output terminals between the emitter electrodes of said eleventh and twelfth transistors, respectively;
(f) signal input means for supplying an input signal to at least one of base electrodes of said eleventh and twelfth transistors; and
(g) signal output means connected to at least one of said first and second loads.

10. A gain control circuit according to claim 9 further including first through fourth resistors, each of said first and second resistors being interposed between said input terminal and the emitter electrode of said eleventh transistor and between said output terminal and the emitter electrode of said twelfth transistor, and said third and fourth resistors being connected between the emitter electrodes of said thirteenth and fourteenth transistors and said second reference DC potential, respectively.

11. A gain control circuit according to claim 9, further including a pair of further transistors each of which is connected to said eleventh and twelfth transistors with a Darlington configuration, respectively.

* * * * *